United States Patent

Lin

[19]

[11] Patent Number: 6,113,412
[45] Date of Patent: Sep. 5, 2000

[54] ELECTRICAL CONNECTOR

[75] Inventor: Nick Lin, Hsin-Chuang, Taiwan

[73] Assignee: Hon Hai Precision Ind. Co., Ltd., Taipei Hsien, Taiwan

[21] Appl. No.: 09/360,925

[22] Filed: Jul. 26, 1999

[30] Foreign Application Priority Data

Apr. 9, 1999 [TW] Taiwan .................................. 88205501

[51] Int. Cl.[7] .................................................. H01R 13/625
[52] U.S. Cl. ........................................... 439/342; 439/858
[58] Field of Search ...................................... 439/342, 858, 439/861, 259

[56] References Cited

U.S. PATENT DOCUMENTS

| | | | |
|---|---|---|---|
| 5,044,973 | 9/1991 | Noda et al. | 439/342 |
| 5,092,789 | 3/1992 | Sinclair | 439/342 |
| 5,616,044 | 4/1997 | Tsai | 439/342 |
| 5,658,160 | 8/1997 | Lai | 439/342 |
| 5,797,774 | 8/1998 | Kaneko | 439/342 |

*Primary Examiner*—Gary F. Paumen
*Attorney, Agent, or Firm*—Wei Te Chung

[57] ABSTRACT

An electrical connector comprises a dielectric base defining a number of contact receiving slots therein, a slidable cover fixed to the base and defining a number of pin receiving holes for receiving corresponding pins of an IC package therein, and a number of contacts received in the corresponding contact receiving slots of the base. Each contact comprises a U-shaped, non-symmetrical guiding portion for guiding a corresponding pin of the IC package to electrically connect with the contact, a contact portion comprising a pair of contact tabs extending from free ends of the guiding portion and defining a gap for engaging the corresponding pin of the IC package, a main body connected to the guiding portion for supporting the contact, and a solder pad extending from a lower edge of the main body for being surface mounted to a circuit board. The guiding portion forms a coined convex collar section on an upper edge between which the corresponding pin of the IC package is inserted into a collar chamber defined within the guiding portion. When the cover is driven to slide, the coined convex collar sections smoothly guide the pins of the IC package to enter into the gap between the contact tabs and decrease frictional resistance exerted on the pins by the contacts.

15 Claims, 10 Drawing Sheets

ELECTRICAL CONNECTOR

BACKGROUND OF THE INVENTION

The present invention relates to an electrical connector, and particularly to a zero insertion force (ZIF) connector having contacts which ensure improved signal transmission between an IC package and a circuit board.

Conventional ZIF connectors adapted for electrically connecting an IC package to a circuit board are disclosed in Taiwan Patent Application Nos. 83214436 and 86302100. Referring to FIGS. 1A and 1B, a conventional connector comprises a dielectric base 80, a slidable cover 81 fixed to the base, a cam lever 82 attached between aligned side edges of the base 80 and the cover 81 for driving the cover to slide along a top surface of the base 80, and a plurality of contacts 83 received in corresponding contact receiving passageways 801 defined in the base 80.

Each contact 83 comprises a base plate 831, a curved portion 832 extending from a lower edge of the base plate 831, and a connecting leg 833 downwardly extending from the base plate 831 for electrically connecting with a circuit board (not shown). The curved portion 832 has a pair of curved arms (not labeled) distanced from each other at the lower edge of the base plate 831 and connecting with each other at opposite ends thereof. The curved portion 832 forms a wide gap 834 adjacent to a narrow gap 835, and a pair of flanges 836 inwardly projecting from a junction between the wide gap 834 and the narrow gap 835. When the IC package (not shown) is positioned on the cover 81, pins of the IC package are received in the wide gaps 834 of the corresponding contacts 83. Due to the sliding movement of the cover 81 driven by the cam lever 82 along the top surface of the base 80, the pins are driven to move from the wide gaps 834 into the narrow gaps 835 by the guidance of the flanges 836. Thus, the pins of the IC package electrically connect with the corresponding contacts 83 of the ZIF connector.

However, the pins of the IC package may be improperly disposed in the corresponding pin receiving passageways of the cover 81, so that the pins may not be positioned in the center of the corresponding wide gaps 834. Thus, when the pins are driven to move from the wide gaps 834 into the narrow gaps 835, each pin may only contact a single curved arm whereby the single curved arm may be burdened with too large a force, which may break the single arm resulting in poor signal transmission through the connector.

Furthermore, the symmetrical design of the conventional contact 83 usually provides a pair of symmetrical guiding portions such as the curved arms to contact the corresponding pin of the IC package. Thus, frictional forces exerted on the pins are simultaneously applied by both curved arms thereby greatly increasing resistance and hindering insertion of the pins into proper contact positions. The increased resistance may wear away a metal plate coating on the pins and the contacts resulting in poor signal transmission.

In addition, when the contacts 83 are soldered to a circuit board (not shown), the solder pads 833 of the contacts 83 are apt to become misaligned due to different thermal expansions between the base 80 and the circuit board resulting from the different coefficients of thermal expansion (CTE) thereof. The misalignment of the solder pads 833 of the contacts 83 results in unstable and unreliable signal transmission through the connector.

BRIEF SUMMARY OF THE INVENTION

A main object of the present invention is to provide an electrical connector having contacts which facilitate smooth insertion of pins of an IC package thereby preventing breakage of the contacts and ensuring electrical stability and durability of the connector.

Another object of the present invention is to provide an electrical connector for establishing electrical connection between an IC package and a circuit board, the connector having contacts which reduce frictional resistance exerted on pins of the IC package when the pins of the IC package are driven to move to electrically connect with the corresponding contacts of the connector.

A further object of the present invention is to provide an electrical connector comprising contacts having an auto-adjustment feature for preventing the contacts from misalignment due to different thermal expansions between the connector and a circuit board, to which the connector is fixed, resulting from different coefficients of thermal expansion of the connector and the circuit board.

An electrical connector in accordance with the present invention comprises a dielectric base defining a plurality of contact receiving slots therein, a slidable dielectric cover fixed to the base for connecting an IC package with the connector, and a plurality of contacts received in the corresponding contact receiving slots for electrically connecting pins of the IC package with a circuit board.

Each contact comprises a U-shaped non-symmetrical guiding portion for guiding a corresponding pin of the IC package to electrically connect with the contact, a contact portion extending from free ends of the guiding portion, a main body connected to the guiding portion for supporting of the contact, and a solder pad extending from the main body for being surface mounted to a circuit board. The contact portion comprises a pair of contact tabs and defining a narrow gap therebetween for insertion of the corresponding pin of the IC package therein The guiding portion forms a coined convex collar section on an upper edge thereof between which the corresponding pin of the IC package is inserted into a collar chamber defined within the loop-shaped guiding portion. The coined convex collar section of the guiding portion smoothly guides the pin of the IC package into the collar chamber, and from the collar chamber into the gap between the contact tabs thereby decreasing a frictional resistance exerted on the pins by the contact.

The guiding portion and the contact tabs are in fact connected in a form of a non-symmetrical loop. The non-symmetrical loop forms a stationary arm and a movable arm. The stationary arm extends from the main body and has a linear stationary section, while the movable arm is cantilevered and movable relative to the stationary arm.

When the corresponding pin of the IC package is driven to move from the collar chamber of the guiding portion into the narrow gap between the contact tabs, the pin slides along the linear stationary section of the stationary arm toward the gap of the contact portion. When the pin approaches the gap, the movable arm is deflected by the pin away from the stationary arm to allow the pin to enter into the narrow gap, while the stationary arm abuts against a support of a side wall of the corresponding contact receiving slot in the base. Thus, the frictional resistance exerted on the pin of the IC package is greatly reduced compared with that exerted by the conventional symmetrically designed contact as described above. Therefore, the contacts in accordance with the present invention and the pins of the IC package prevent breakage of the pins and contact due to excessive force exerted on the pins of the IC package and a counter force exerted on the contacts.

3

Other objects, advantages and novel features of the invention will become more apparent from the following detailed description when taken in conjunction with the accompanying drawings.

DETAILED DESCRIPTION OF THE INVENTION

Figure 1A:
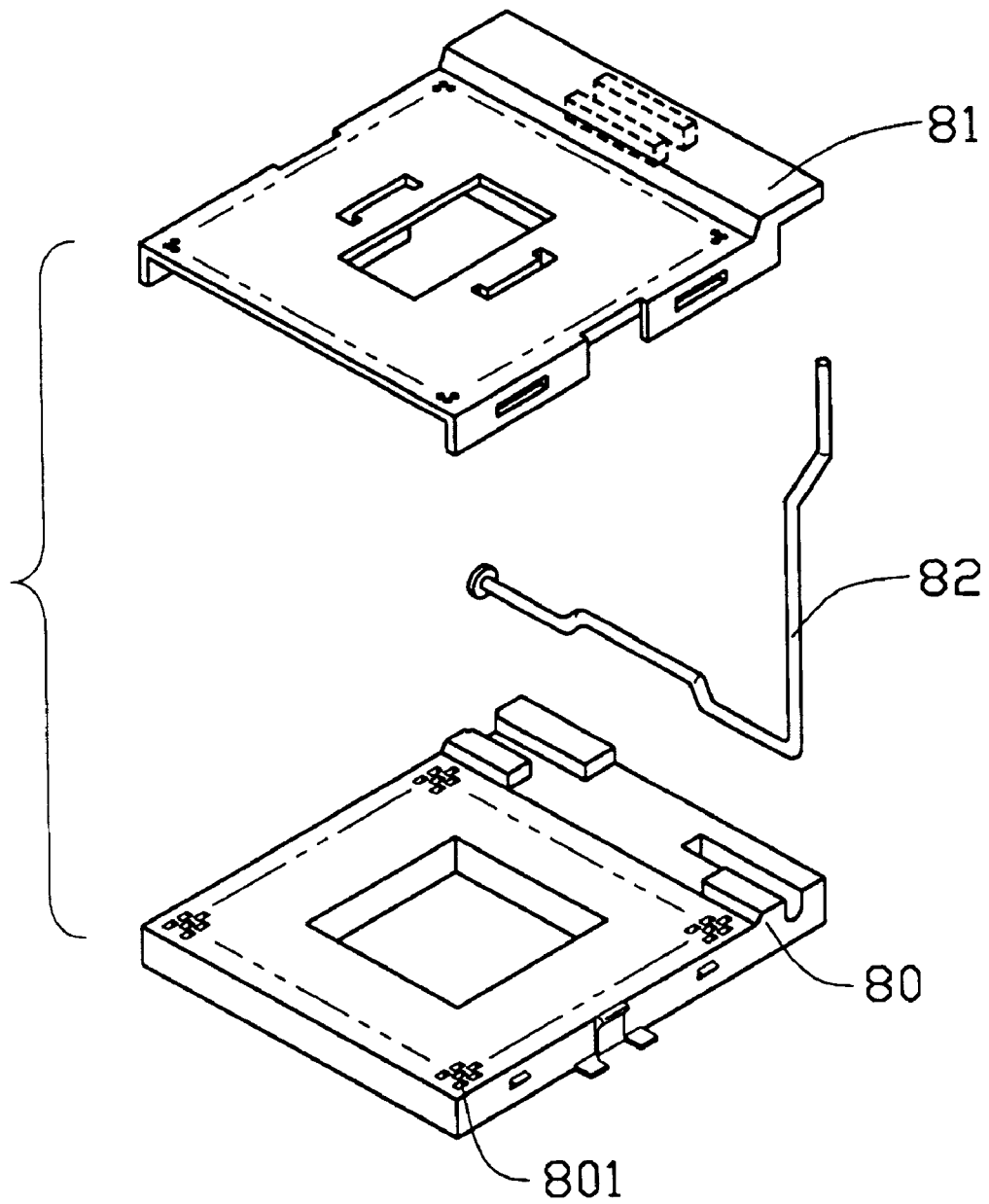
FIG. 1A is an exploded view of a conventional zero insertion force (ZIF) connector.
Figure 1B:
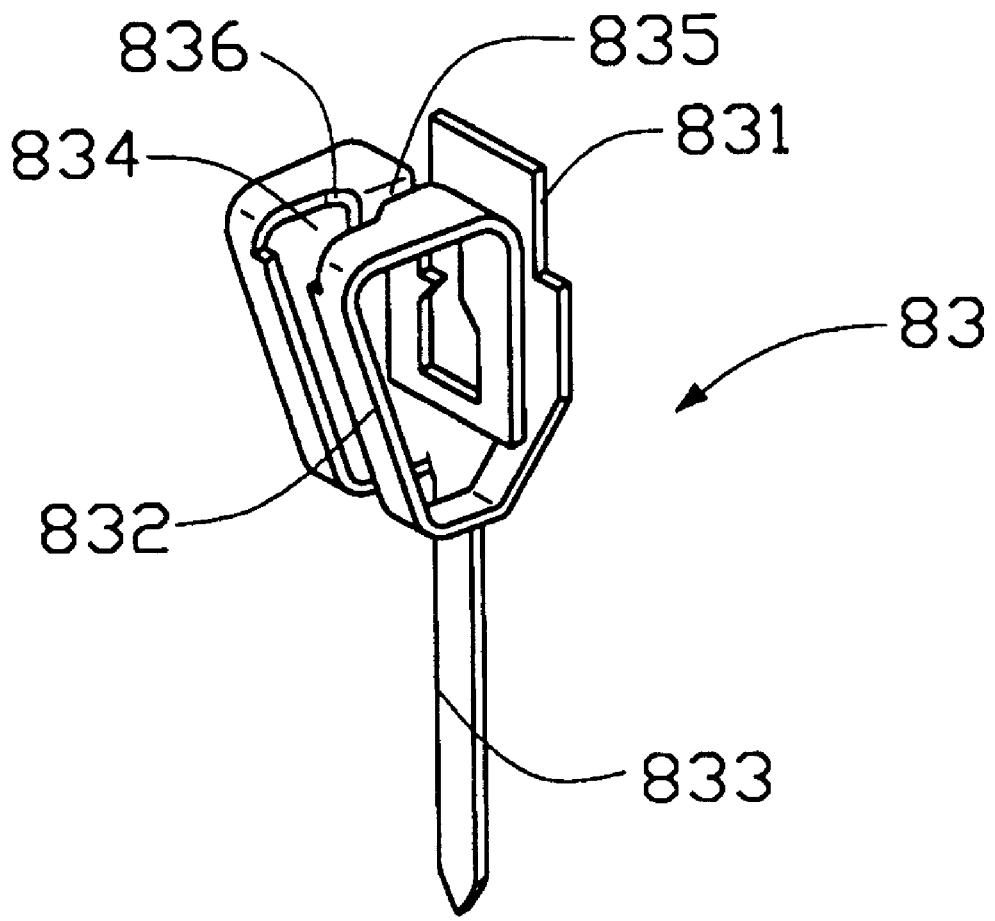
FIG. 1B is a perspective view of a contact of the conventional ZIF connector.
Figure 2:
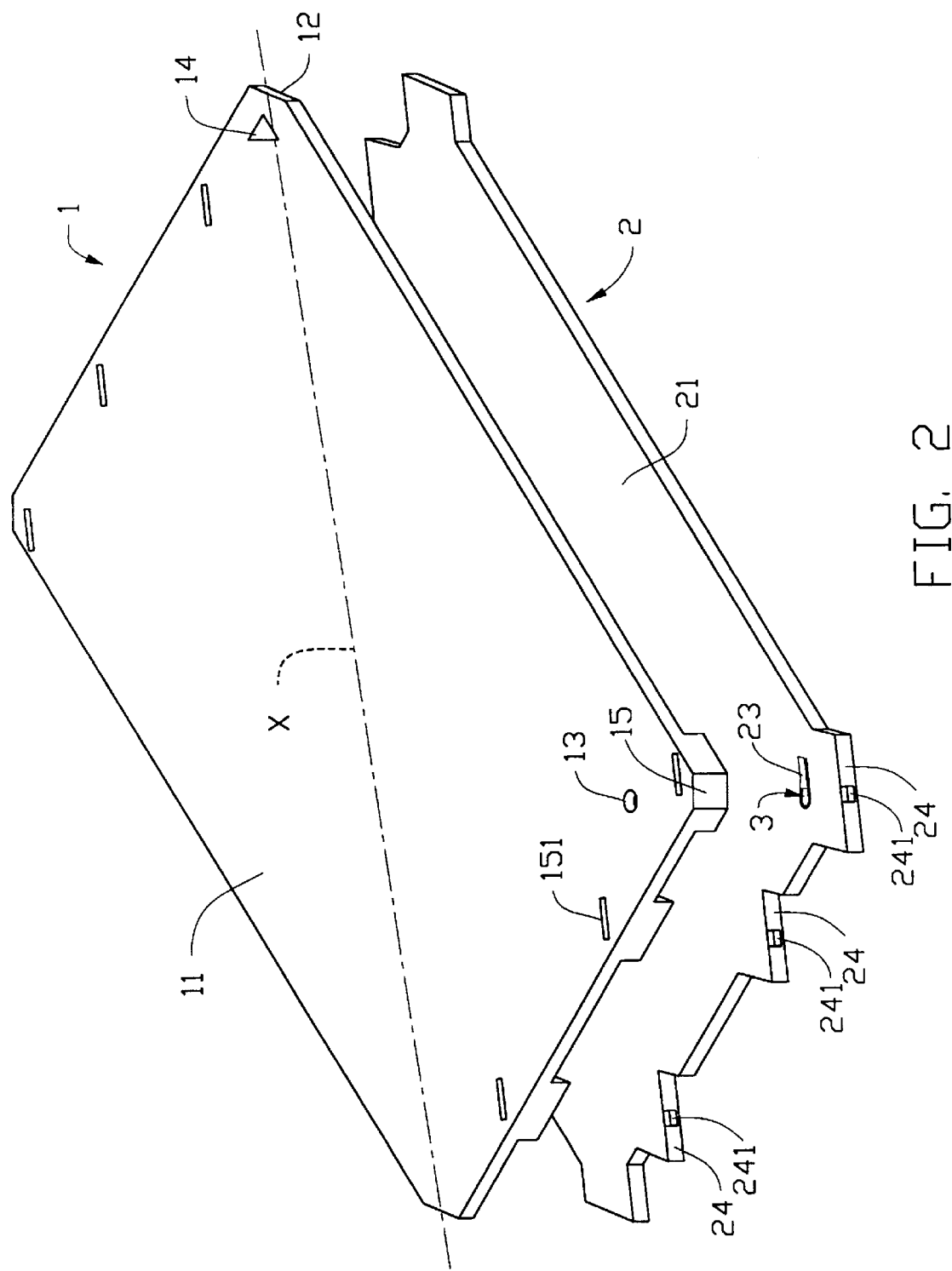
FIG. 2 is an exploded view of an electrical connector of the present invention.
Figure 3:
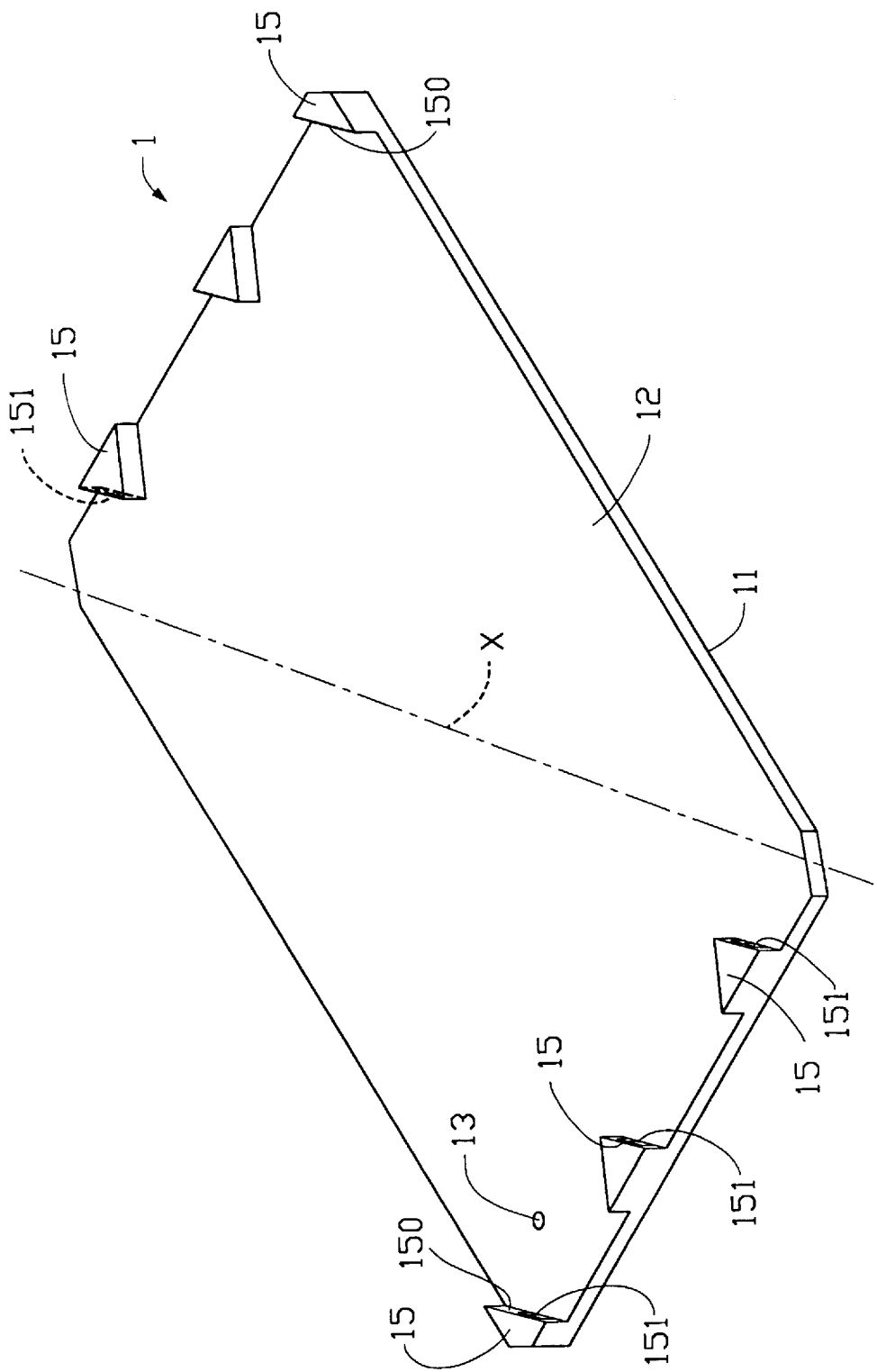
FIG. 3 is a perspective view of a cover of FIG. 2.

Referring to FIGS. 2 and 3, an electrical connector in accordance with the present invention comprises a dielectric cover 1, a dielectric base 2 fixed to the cover 1, and a plurality of contacts 3 received in the base 2. The cover 1 defines a plurality of pin receiving holes 13 (only one shown) for receiving corresponding pins 4 (FIGS. 8 and 9) of an IC package (not shown) between a top face 11 and a bottom face 12 thereof. Three spaced latching blocks 15 are formed on the bottom face 12 of the cover 1 on opposite edges thereof, respectively. A passageway 151 is defined in each latching block 15 and exposed to the top face 11 of the cover 1 and a side surface 150 of the latching block 15. A label 14 is provided on the top face 11 to indicate a diagonal direction X. The base 2 defines a plurality of contact receiving slots 23 for receiving the corresponding contacts 3 therein, and forms three spaced projections 24 corresponding to the three spaced latching blocks 15 of the cover 1. Each projection 24 forms a latching tab 241 for engaging with the corresponding passageway 151 of the cover 1.

Figure 4:
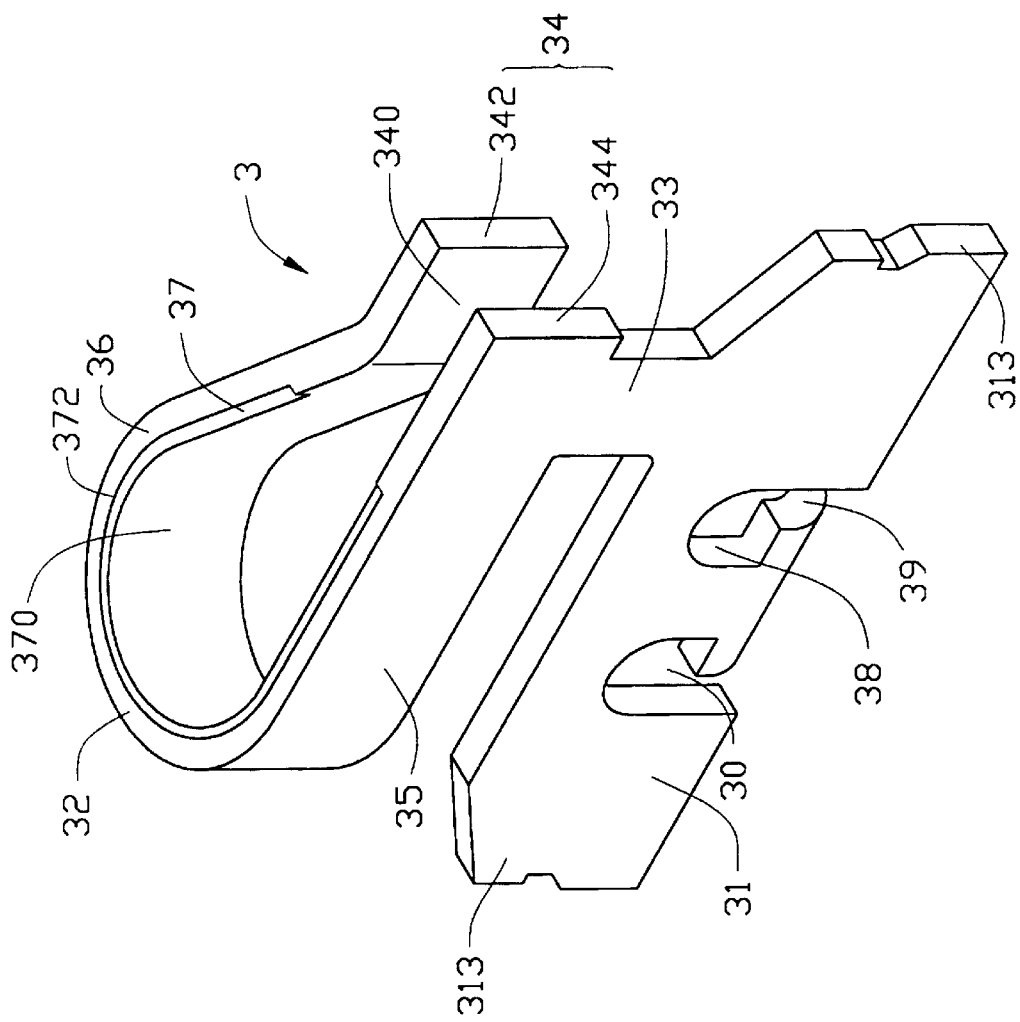
FIG. 4 is a perspective view of a contact in accordance with a first embodiment of the present invention.
Figure 5:
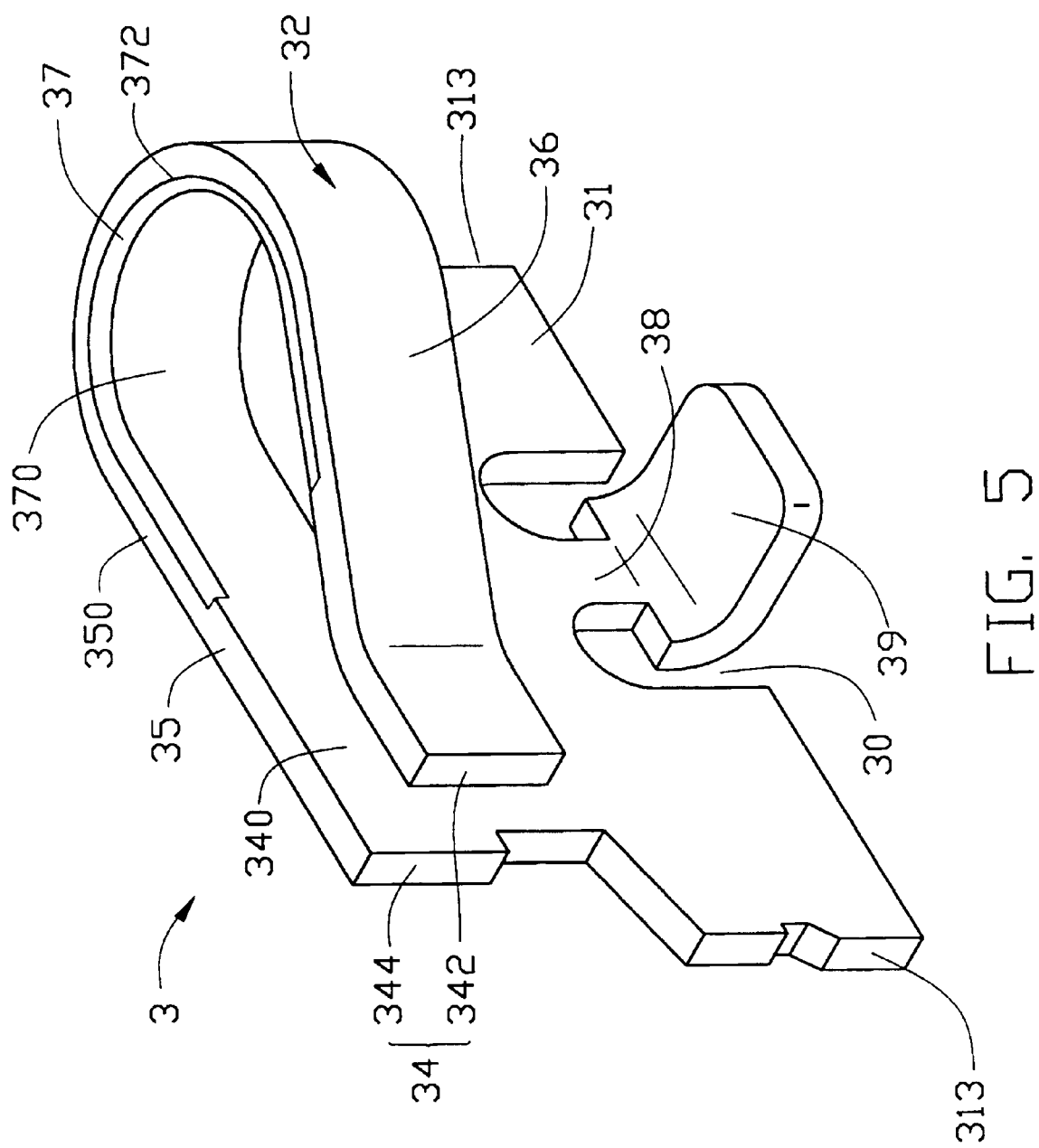
FIG. 5 is another perspective view of the contact of FIG. 4.

Referring to FIGS. 4 and 5, each contact 3 comprises a main body 31 for supporting the contact 3, a U-shaped guiding portion 32 for guiding the corresponding pin 4 of the IC package to electrically engage with the contact 3, a contact portion 34 including a pair of contact tabs 342, 344 extending from ends of the guiding portion 32 and defining a gap 340 therebetween for receiving the corresponding pin 4 of the IC package, thereby electrically connecting with the contact tabs 342, 344, and a solder pad 39 for being surface mounted to the circuit board.

The guiding portion 32 and the contact tabs 342, 344 of each contact 3 form a non-symmetrical loop (not labeled). The non-symmetrical loop forms a stationary arm 35 and a movable arm 36. The stationary arm 35 extends from the main body 31 and has a linear stationary section 350, while the movable arm 36 is cantilevered and movable relative to the stationary arm 35.

4

The guiding portion 32 forms a coined convex collar section 37 on an upper inner edge 372 thereof between which the pins 4 of the IC package are inserted into a collar chamber 370 defined within the guiding portion 32. The coined convex collar section 37 smoothly guides the pins 4 of the IC package into the collar chamber 370 during pin insertions and from the collar chamber 370 into the gap 340 between the contact tabs 342, 344 during movement of the cover 1 to its pin lock position, thereby decreasing a frictional resistance exerted on the pins 4 by the two arms 35, 36.

The main body 31 is elongate and is connected to the stationary arm 35 of the loop via a narrow first neck 33. The first neck 33 provides the stationary arm 35 with proper resiliency relative to the main body 31. The main body 31 forms a pair of barbs 313 on opposite edges thereof for being interferentially fit and secured in the corresponding contact slots 23 of the base 2.

The solder pad 39 extends from a lower edge of the main body 31 via a narrow second neck 38 and generally extends perpendicularly from the second neck 38 for being surface mounted onto the circuit board. A pair of cutouts 30 is defined in the main body 31 on opposite sides of the second neck 38. The second neck 38 thus provides the solder pad 39 with proper resiliency relative to the main body 31. Moreover, the second neck 38 does not extend beyond the main body 31 thereby reducing a height of the contact 3 and promoting miniaturization of the connector of the present invention. Therefore, if different thermal expansions of the connector and the circuit board occur due to different coefficients of thermal expansion (CTE) when the connector is surface mounted to the circuit board, the first and second necks 33, 38 allow appropriate deformation resulting from different forces exerted by the connector and the circuit board, respectively. Thus, misalignment of the contacts 3 caused by the different CTEs of the connector and the circuit board is avoided thereby ensuring signal transmission therethrough. It is also noted that the solder pad 39 substantially includes a relatively larger horizontal section 39a and a relatively smaller vertical section 39b wherein the horizontal section 39a is for surface mounting to the circuit board, while the vertical section 39b is to prevent solder from upward wicking. It is because the narrow second neck 38 may induce capillary action for the melted solder if the bottom end of the narrow second neck 38 is directly seated on the circuit board.

Figure 6:
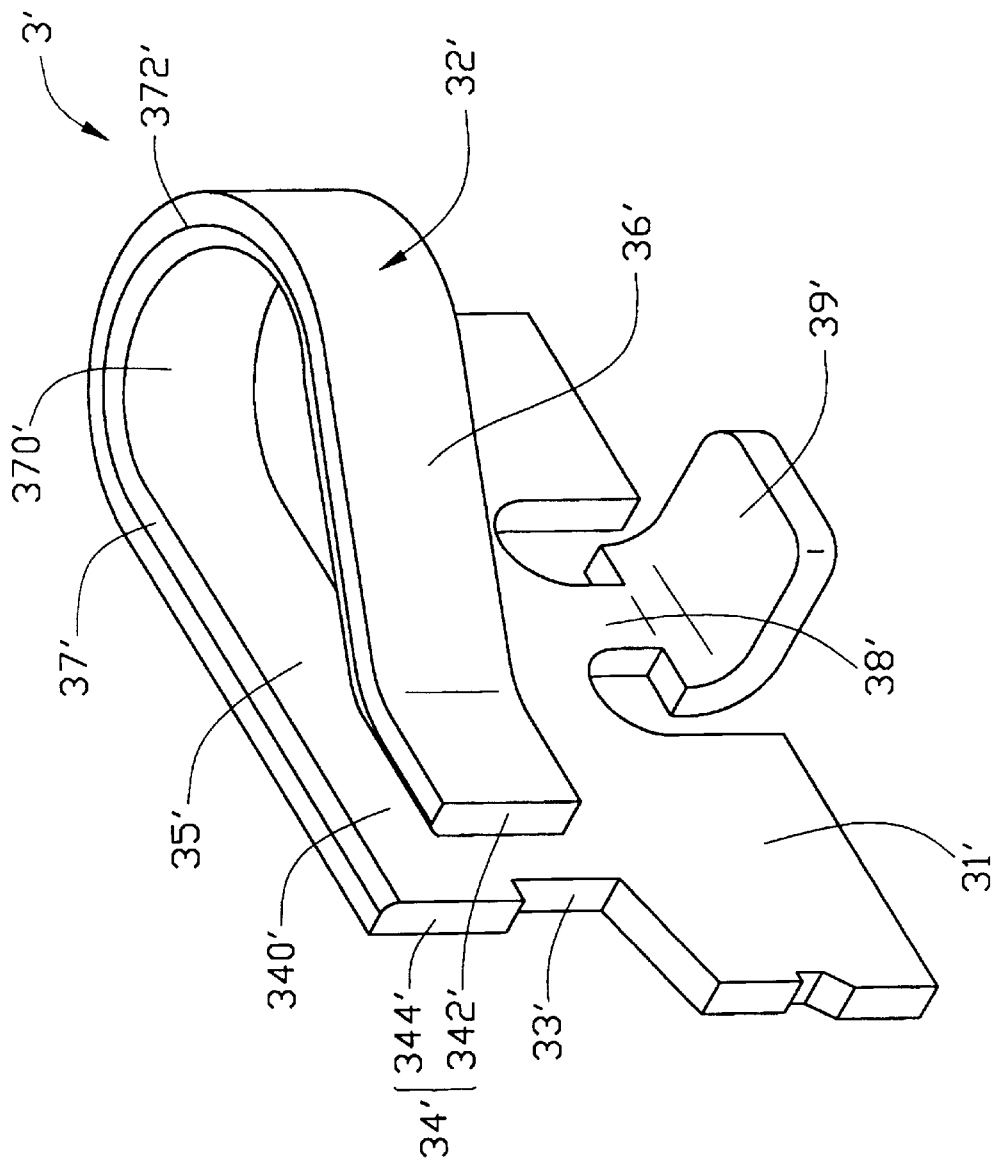
FIG. 6 is a perspective view of a contact in accordance with a second embodiment of the present invention.

Referring also to FIG. 6, a contact 3' in accordance with a second embodiment of the present invention also comprises a U-shaped guiding portion 32', a contact portion 34' including a pair of contact tabs 342', 344' extending from free ends of the guiding portion 32', an elongate main body 31' for supporting the contact 3', and a solder pad 39' extending from a lower edge of the main body 31' via a second neck 38'. The guiding portion 32' and the contact tabs 342', 344' form a non-symmetrical loop. The non-symmetrical loop forms a stationary arm 35' and a movable arm 36'. The main body 31' is connected with the stationary arm 35' of the loop via a first neck 33'. The distinction between the contact 3' of the second embodiment and the contact 3 of the first embodiment is that a coined convex collar section 37' is formed on an upper inner edge of the entire loop including the guiding portion 32' and the contact portion 34', while the coined convex collar section 37 is only formed on the upper inner edge of the guiding portion 32 of the contact 3. The coined convex collar section 37' of the contact 3' guides the pin 4 of the IC package to move from a collar chamber 370' defined within the guiding portion 32' to a gap 340' defined between the contact tabs 342', 344' with a low frictional resistance.

Figure 7:
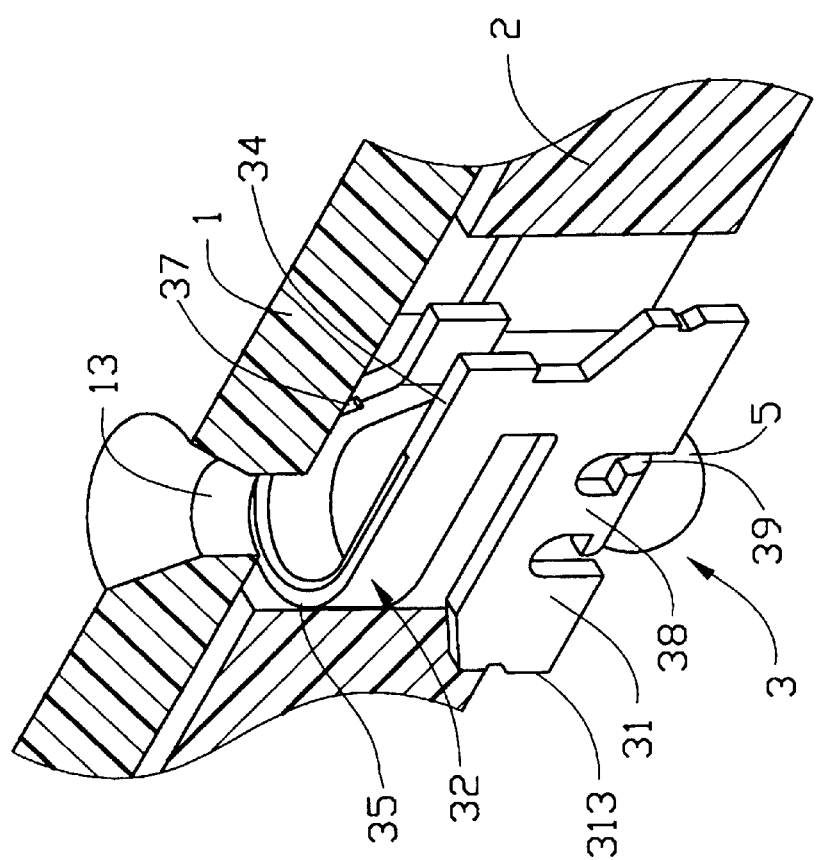
FIG. 7 is a cross-sectional view showing the contact of FIG. 4 fixed in a base of FIG. 2.
Figure 8:
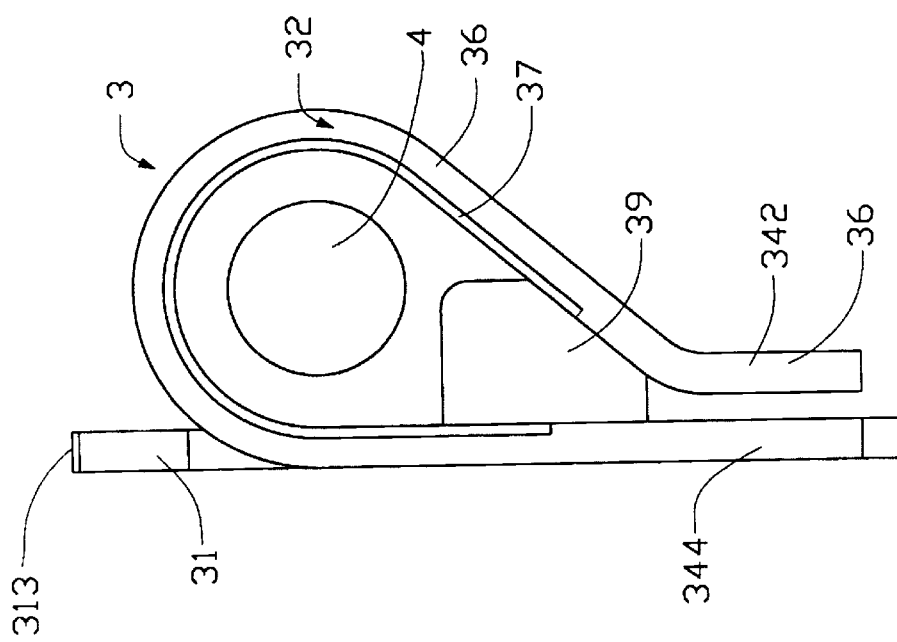
FIG. 8 is a top plan view showing a pin of an IC package before being fully engaged with the contact of FIG. 4.
Figure 9:
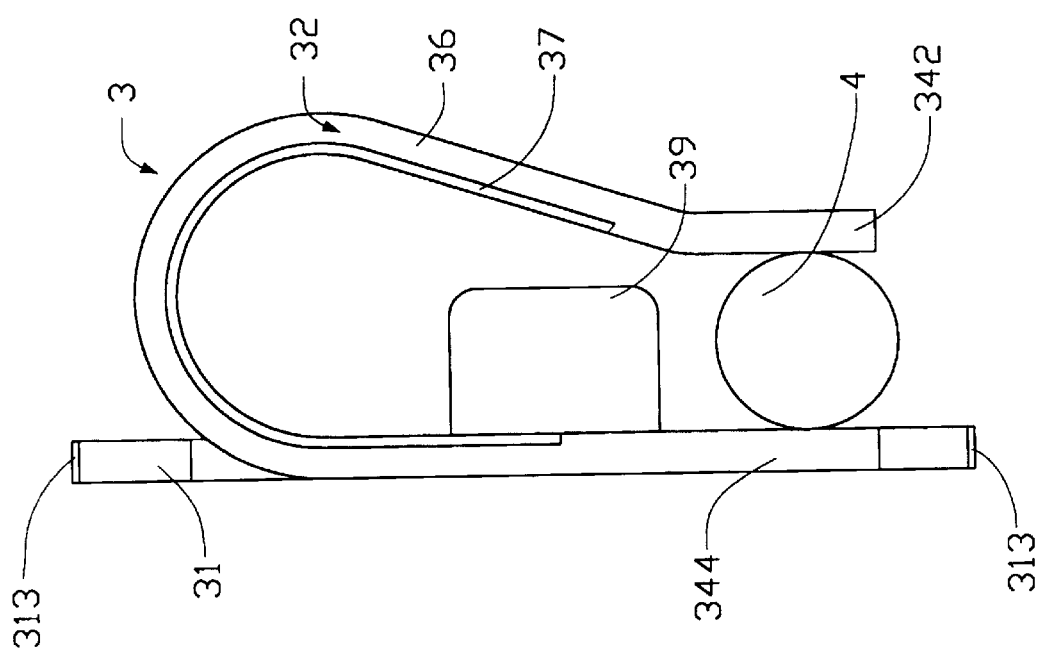
FIG. 9 is a top plan view showing the pin of the IC package fully engaged with the contact of FIG. 4.

Referring further to FIGS. 7, 8 and 9, in assembly, the contacts 3, 3' are substantially identical to each other in operation. Therefore, only the operation of the contact 3 is described below. The contacts 3 are deposited into the corresponding contact receiving slots 23 of the base 3. The cover 1 is then fixed to the base 2 with the bottom face 12 of the cover 1 abutting against a top surface 21 of the base 2. The latching blocks 15 of the cover 1 engage with the corresponding projections 24 of the base 2. The latching tabs 241 of the base 2 interferentially fit within the corresponding passageways 151 of the cover 1. Thus, the connector of the present invention is fully assembled.

The IC package is then disposed on the top face 11 of the cover 1 and the pins 4 are inserted into the corresponding pin receiving slots 13. An exterior tool drives the cover 1 to slide along the top surface 21 of the base 2 in the diagonal direction X indicated by the label 14. Thus, the pins 4 electrically connect with the corresponding contacts 3 of the connector. A plurality of solder balls 5 are attached to bottom surfaces of the solder pads 39 of the corresponding contacts 3. The connector along with the IC package and the solder balls 5 is then surface mounted to the circuit board.

Before the cover 1 is driven to move, the pin receiving holes 13 of the cover 1 align with the collar chambers 370 of the corresponding contacts 3 in the base 2, and the pins 4 extend into the collar chambers 370 of the corresponding contacts 3. In theory, the pins 4 should be disposed directly in the center of the collar chambers 370 of the corresponding contacts 3. When the cover 1 is driven to slide, each pin 4 should be driven to move from the collar chamber 370 toward the gap 340 of the corresponding contact 3. Each pin 4 is driven to abut against the corresponding stationary arm 35 and the movable arm 36. Since each stationary arm 35 is supported by the side wall of the corresponding contact receiving slot 23 of the base 2, the stationary arms 35 should not move while the movable arm 36 would be deflected away relative to the stationary arm 35 when the pin 4 approached a junction between the collar chamber 370 and the gap 340. In practical operation, the pins 4 may not be centrally disposed in the corresponding collar chambers 370 of the contacts 3. Due to the guidance provided by the coined convex collar section 37, each pin 4 is driven to abut against the stationary arm 35 and to deflect the movable arm 36 away relative to the stationary arm 35. The pin 4 is then driven to move from the collar chamber 370 into the gap 340 of the contacts 3.

The coined convex collar section 37 of each contact 3 smoothly guides the corresponding pin 4 of the IC package to properly engage with the corresponding contact 3 thereby ensuring reliable signal transmission between the IC package and the circuit board. Moreover, the frictional resistance exerted on the pins 4 by the contacts 3 is decreased due to the smooth guidance provided by the coined convex collar sections 37 and due to the pin making contact only with the stationary arm 35 before the pin 4 arriving at the junction between the collar chamber 370 and the gap 340 and engages with the contact tabs 342, 344.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for electrically interconnecting an IC package and a circuit board, comprising:

a dielectric base defining a plurality of contact receiving slots;

a dielectric cover being slidably mounted to the dielectric base and defining a plurality of pin receiving holes for receiving corresponding pins of the IC package; and a plurality of contacts each comprising a main body secured in the receiving slot, a solder pad outwardly extending from a lower side of the main body for surface mounting to the circuit board, and a substantially U-shaped guiding portion outwardly extending from an upper side of the main body, a coined convex collar section being formed on an upper inner edge of the guiding portion for guiding a smooth insertion of each pin of the IC package, a pair of contact tabs being formed at ends of the guiding portion for electrically contacting a corresponding pin of the IC package;

wherein one of the contact tabs is connected with the main body at an upper edge of the main body;

wherein a linear stationary arm extends from the upper edge of the main body and constitutes a part of the guiding portion and the contact tab connected with the main body, and wherein a curved movable arm connects with the stationary arm and constitutes another part of the guiding portion, a collar chamber being defined by the stationary arm and the movable arm for insertion of an IC package pin.

2. The electrical connector as claimed in claim 1, wherein the guiding portion of each contact defines a collar chamber surrounded by the coined convex collar section for receiving a corresponding pin of the IC package.

3. The electrical connector as claimed in claim 2, wherein the contact tabs define a gap therebetween in communication with the collar chamber for receiving the pin of the IC package driven from the collar chamber to electrically contact the contact tabs.

4. The electrical connector as claimed in claim 1, wherein a gap is defined between individual free ends of the stationary arm and the movable arm and is in communication with the collar chamber for receiving the IC package pin driven from the collar chamber to electrically contacting the free ends of the stationary arm and the movable arm.

5. The electrical connector as claimed in claim 1, wherein the stationary arm of each contact comprises a linear stationary section abutting against a side wall of the corresponding contact receiving slot of the dielectric base.

6. The electrical connector as claimed in claim 1, wherein the main body of each contact is elongate and forms a pair of barbs on opposite edges thereof for engaging with corresponding contact receiving slot of the dielectric base.

7. The electrical connector as claimed in claim 1, wherein a first neck is formed between the guiding portion and the main body for providing the guiding portion with proper resiliency relative to the main body.

8. The electrical connector as claimed in claim 1, wherein a second neck is formed between the main body and the solder pad for providing the solder pad with proper resiliency relative to the main body.

9. The electrical connector as claimed in claim 1, wherein a plurality of projections extend from opposite edges of the dielectric base, each projection forming a latching tab, and wherein the slidable dielectric cover forms a plurality of blocks on opposite ends at a bottom face thereof corresponding to the projections of the dielectric base, a passageway being defined in the slidable dielectric cover and exposed to a top face of the slidable dielectric cover, the passageway simultaneously extending through each block and exposed to an outer lateral surface of the block for engaging with a corresponding latching tab of the dielectric base.

10. An electrical socket contact comprising:

a main body;

a U-shaped guiding portion extending from an upper edge of the main body and defining a collar chamber, a coined convex collar section being formed on an upper inner edge of the guiding portion and surrounding the collar chamber for guiding smooth insertion of an IC package pin into the collar chamber;

a contact portion including a stationary and a movable contact tab extending from ends of the U-shaped guiding portion, a gap being defined between the contact tabs and communicating with the collar chamber, the coined convex collar section guiding a movement of the IC package pin driven from the collar chamber toward the gap; and a solder pad outwardly extending from a lower edge of the main body for electrically connecting with a circuit board.

11. The contact as claimed in claim 10, wherein a first neck is formed between the U-shaped guiding portion and the main body for providing the U-shaped guiding portion with proper resiliency relative to the main body.

12. The contact as claimed in claim 10, wherein a second neck is formed between the main body and the solder pad for providing the solder pad with proper resiliency relative to the main body.

13. The contact as claimed in claim 10, wherein the main body forms a pair of barbs on opposite edges thereof.

14. The contact as claimed in claim 10, wherein the coined convex collar section extends from the upper inner edge of the guiding portion to an upper inner edge of the contact portion.

15. A contact for use within a connector, comprising:

a planar main body with retention means thereon for latchable engagement within a corresponding passageway in the connector; and a U-shaped guiding portion and a pair of contact tabs disposed above the main body, said pair of contact tabs respectively connected at two opposite ends of said U-shaped guiding portion, said U-shaped guiding portion and said pair of contact tabs commonly forming a non-symmetrical loop including a stationary arm and a movable arm; wherein a narrow neck connects the main body and the contact tab on the stationary arm, and said stationary arm includes a linear stationary section while the movable aim is cantilevered and movable relative to the stationary arm.

* * * * *